US006836669B2

(12) United States Patent
Miyake et al.

(10) Patent No.: US 6,836,669 B2
(45) Date of Patent: Dec. 28, 2004

(54) PORTABLE TELEPHONE PROVIDED WITH IMAGE PICKUP DEVICE (75) Inventors: Hiroyuki Miyake, Tokyo (JP);
Noriyuki Komori, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 534 days.

(21) Appl. No.: 09/880,016

(22) Filed: Jun. 14, 2001

(65) Prior Publication Data
US 2002/0065102 A1 May 30, 2002

(30) Foreign Application Priority Data
Nov. 30, 2000 (JP) .................................... 2000-364647

(51) Int. Cl.[7] .............................................. H04B 1/38
(52) U.S. Cl. ............................ 455/556.1; 455/550.1; 455/557; 455/575.1; 455/90.3; 348/14.01; 348/14.02
(58) Field of Search ......................... 455/550.1, 556.1, 455/557, 575.1, 90.3; 348/14.01, 14.02

(56) References Cited
U.S. PATENT DOCUMENTS 6,137,525 A  * 10/2000  Lee et al. ................. 348/14.02
6,427,078 B1 *  7/2002  Wilska et al. ............ 455/550.1

FOREIGN PATENT DOCUMENTS

| EP | 1 081 944 | 3/2001 | |
| EP | 1 148 716 | 10/2001 | |
| EP | 1148716 A1 * | 10/2001 | .......... H04N/5/225 |
| JP | 1-286592 | 11/1989 | |
| JP | 08-294030 | 11/1996 | |
| JP | 10-313452 | 11/1998 | |
| JP | 10-336496 | 12/1998 | |
| JP | 11-17992 | 1/1999 | |
| JP | 11-55381 | 2/1999 | |
| JP | 11-103404 | 4/1999 | |
| JP | 11-191865 | 7/1999 | |
| JP | 11191865 A * | 7/1999 | .......... H04N/5/335 |
| JP | 2000-92360 | 3/2000 | |
| JP | 2000-324541 | 11/2000 | |
| WO | WO 97/26744 | 7/1997 | |

* cited by examiner

Primary Examiner—Lee Nguyen
Assistant Examiner—Minh D. Dao
(74) Attorney, Agent, or Firm—Oblon, Spivak, McClelland, Maier & Neustadt, P.C.

(57) ABSTRACT

A portable telephone provided with an image pickup device includes: a case for the portable telephone; a circuit board for the portable telephone contained in the case and having an opening; an image pickup device having a lens focusing an externally received image and an image pickup element converting the image focused by the lens to an electric signal; and a lead portion electrically connected to the image pickup device and electrically connecting the circuit board and the image pickup device with the image pickup device being inserted to the opening of the circuit board.

8 Claims, 8 Drawing Sheets

PORTABLE TELEPHONE PROVIDED WITH IMAGE PICKUP DEVICE

BACKGROUND OF THE INVENTION

1. Field of the Invention

The present invention relates to a portable telephone which has been reduced in size and thickness and is provided with an image pickup device for converting an image received from a lens to an electric signal by an image pickup element.

2. Description of the Background Art

Figure 18A:
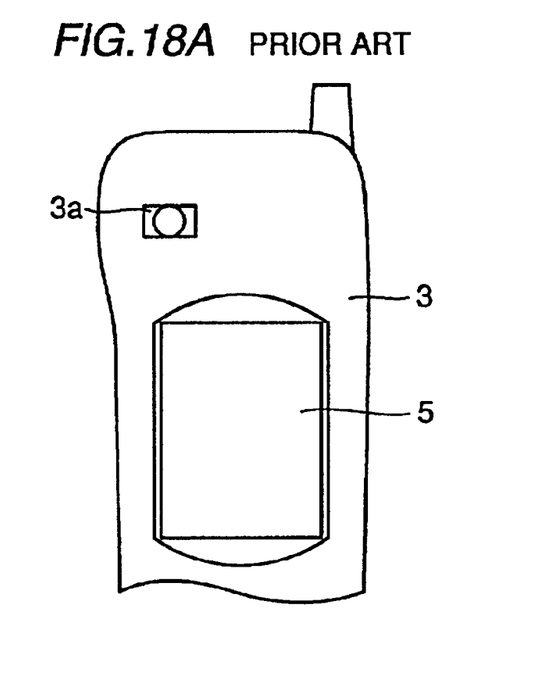
FIGS. 18A and 18B are respectively a front view and a sectional side view partially showing a conventional portable telephone provided with an image pickup device.
Figure 18B:
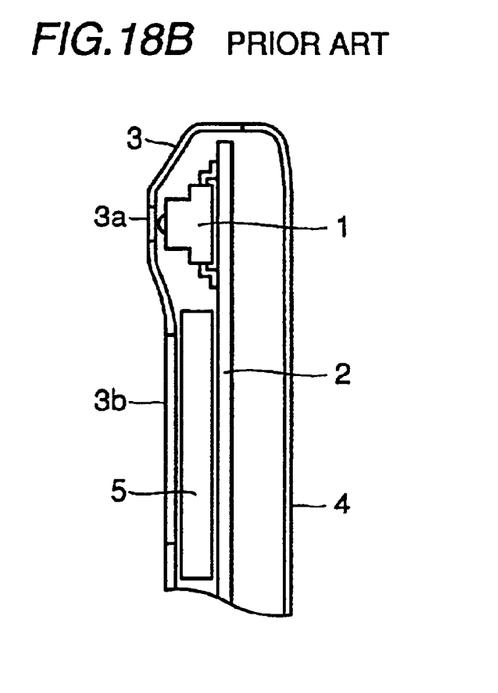
Figure 19:
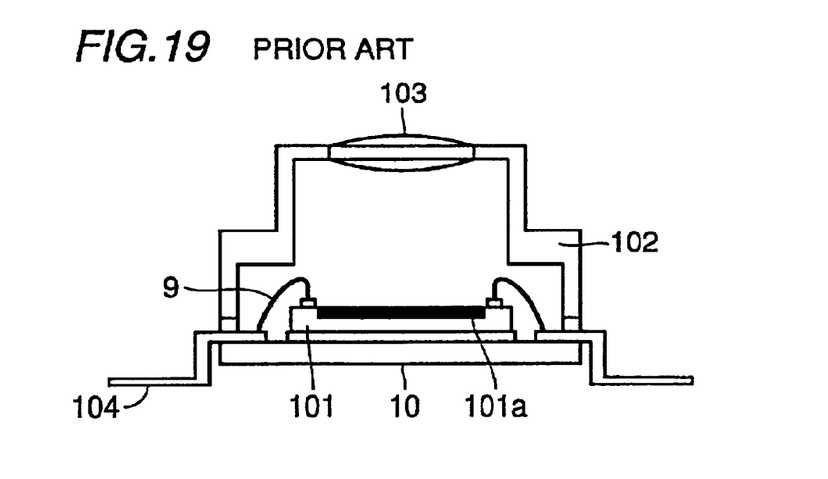
FIG. 19 is a cross sectional view showing the conventional image pickup device.

FIGS. 18A and 18B show an exemplary conventional portable telephone provided with an image pickup device. FIG. 18A is a front view partially showing the conventional portable telephone provided with the image pickup device. FIG. 18A shows a front case 3 of the portable telephone, a front opening 3a of the pickup device, and a liquid crystal display 5. FIG. 18B is a sectional side view of FIG. 18A. FIG. 18B shows an image pickup device 1, a circuit board (mother board) 2 of the portable telephone, a rear case 4, and a front opening 3b of liquid crystal display 5. Image pickup device 1 is electrically connected to and mounted on circuit board 2 by means of, e.g., soldering. FIG. 19 is a cross sectional view showing a structure of conventional image pickup device 1. FIG. 19 shows an image pickup element 101, a light receiving sensor 101a on image pickup element 101, a cylindrical portion for lens 102 also serving as a casing of image pickup device 1, a lens 103, a lead portion for input/output 104 used for the operation of image pickup element 101, and a package 10 integrally formed with lead portion for input/output 104. Image pickup element 101 is contained in package 10. A bonding wire 9 is electrically connected to lead portion for input/output 104. The above described conventional portable telephone provided with the image pickup device has front opening 3a for receiving light that is formed in front case 3 where image pickup device 1 is located. Image pickup device 1 receives light through front opening 3a and converts the image information received by lens 103 to an electric signal for output on the side of the portable telephone.

Generally, the pickup device is provided with a CCD (Charge Coupled Device), CMOS (Complementary Metal Oxide Semiconductor) or the like in a package, and a focusing lens positioned opposite the light receiving surface of the image pickup element. However, since a distance between the light receiving surface and a focusing lens, i.e., a focal distance, is governed by an optical law, the thickness of the image pickup device cannot be made smaller than the focal distance unless some kind of special lens is used. A special lens may ensure a focal distance by bending an optical path in an image pickup device by provision of at least one reflector in an optical system, so as to reduce the distance from the lens to the surface of the image pickup element. However, such a special optical part involves a difficulty in designing and, the bending of the optical path reduces a light amount, a brightness decreases in proportion to the bending frequency, leading to an image pickup device with inferior performance. Moreover, the conventional image pickup device is expensive since a prism mirror or the like is used as a reflector, leading to an expensive image pickup device and portable telephone. In addition, it is difficult to provide the image pickup device with reduced thickness.

The conventional image pickup device as shown in FIGS. 18A and 18B is provided in a space defined by one surface of a circuit board of the portable telephone and an outer case of a portable telephone opposite that surface. Thus, the thickness of the portable telephone becomes large. The large thickness adversely affects the overall outer shape of the portable telephone, e.g., results in a disproportionately large portion where the image pickup device is mounted. On the other hand, if the outer shape of the portable telephone is designed in consideration of the thickness of the portable telephone at the portion where the image pickup device is provided, the overall thickness of the portable telephone becomes large, whereby a portable telephone with reduced size and thickness cannot be provided. Moreover, in the conventional portable telephone provided with an image pickup device, an image pickup direction of the image pickup device is perpendicular to the circuit board on which the image pickup device is provided, so that the image pickup device can only be mounted in a direction that is parallel to a display direction of a liquid crystal display provided on the same circuit board. In this case, when a user takes an image of himself or herself (i.e., a self-portrait), visual lines toward the lens portion of the image pickup device and the liquid crystal display differ. As a result, the user cannot controllably display a desired image onto the liquid crystal display.

When the user takes an image other than the above mentioned self-portrait, e.g., a scenery, he or she takes an image while displaying the taken images onto the liquid crystal display as in a digital camera. However, since the image pickup device can only be mounted with its an image pickup direction being perpendicular to the circuit board, the image pickup device is mounted on the opposite side of the circuit board when images are taken while displaying a scenery or the like onto the liquid crystal display. As a result, the designing of the outer shape of the portable telephone may disadvantageously be restricted.

The present invention is made to solve the aforementioned problems. An object of the present invention is to provide a portable telephone provided with an image pickup device having a novel structure that allows reduction in size and thickness while avoiding the aforementioned problem associated with a disproportionate outer shape of the portion where the image pickup device is mounted.

SUMMARY OF THE INVENTION

To achieve the aforementioned object, a portable telephone with the image pickup device according to one aspect of the present invention includes: a case defining an outer shape of the portable telephone; a circuit board contained in the case and having an opening; an image pickup device; and a lead portion electrically connecting the circuit board and the image pickup device with the image pickup device inserted into the opening of the circuit board. The image pickup device has a lens focusing an externally received image, and an image pickup element converting the image focused by the lens to an electric signal. With this structure, a part of a focal distance in the image pickup device can be included in a thickness of the circuit board. Consequently, the thickness of the portable telephone can approach the focal distance irrespective of the thickness of the circuit board, so that the portable telephone can be reduced in thickness.

Preferably, in the present invention, the lead portion is bent and connected to the image pickup device. As such, the lead portion can be easily connected according to a relative positional relationship between the circuit board and the image pickup device with the image pickup device being inserted in the opening.

In the present invention, preferably, the lead portion is connected to the circuit board on the side opposite to the lens. With this structure, the image pickup device can be mounted by effectively making use of the back surface and the space on the back side of the circuit board, which have not been effectively used heretofore.

In the present invention, preferably, a liquid crystal display is provided in the case, and the lead portion has portions of different shapes on both sides of the image pickup device in such a way as to incline the image pickup device toward the side of the liquid crystal display with respect to the circuit board.

In the above described invention, preferably, the circuit board has first and second surfaces respectively forming front and back sides. The case has front and rear cases primarily covering the first and second surfaces of the circuit board, respectively. The lead portion connects the circuit board and the image pickup device to position the lens on the first surface side of the circuit board and to position the image pickup element on the second surface side of the circuit board. With this structure, a distance between the circuit board and the front case can be restrained with the lens positioned near the front case, so that the portable telephone with reduced thickness can be provided.

To achieve the above mentioned object, the portable telephone of the image pickup device according to another aspect of the present invention includes: a case defining an outer shape of the portable telephone; a circuit board contained in the case and having a cutout portion; an image pickup device; and a lead portion electrically connecting the circuit board and the image pickup device with the image pickup device being inserted into the cutout portion of the circuit board. The image pickup device has a lens focusing an externally received image, and an image pickup element converting the image received by the lens to an electric signal. The image pickup device is mounted on the circuit board to allow image pickup in directions parallel and perpendicular to the surface of the circuit board. Thus, the portable telephone with the image pickup device is provided which is user-friendly and which enables pickup of a user image as well as a forward scenery or the like.

In the above described invention, preferably, the circuit board has first and second surfaces respectively forming front and back sides, and a rotatable mechanism rotatably supporting the image pickup device in the cutout portion such that the image pickup device takes images in a desired direction with respect to the first surface and the second surface of the circuit board. With this structure, the image pickup device is made rotatable in the cutout portion, so that a compact rotatable image pickup device is provided.

In the above described invention, preferably, the rotatable mechanism includes a shaft fixed to the image pickup device, and a bearing rotatably supporting the shaft. Thus, a stable rotatable mechanism can be provided.

In the above described invention, preferably, the rotatable mechanism includes a holding mechanism capable of holding the image pickup device in a desired direction with respect to the first surface and the second surface. As such, the holding mechanism can prevent a user from inadvertently rotating the image pickup device when taking an image in a given direction.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
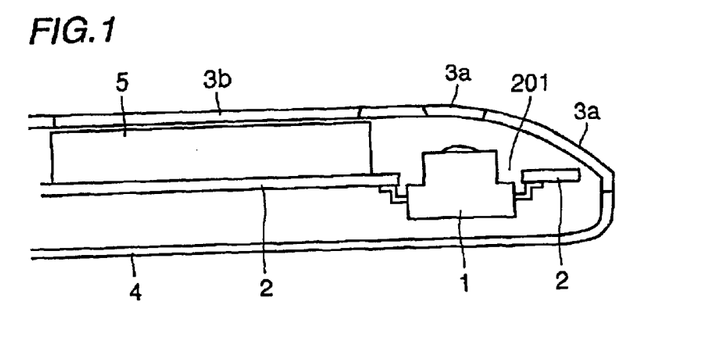
FIG. 1 is a cross sectional view partially showing a portable telephone provided with an image pickup device according to a first embodiment.

Now, the structure of a portable telephone provided with an image pickup device according to the first embodiment of the present invention will be described with reference to FIG. 1. FIG. 1 is a cross sectional view partially showing the portable telephone provided with the image pickup device according to the first embodiment. FIG. 1 shows an image pickup device 1 formed of a CCD, CMOS or the like, and a circuit board (mother board) 2 of the portable telephone. Circuit board 2 has an opening for image pickup device 1 and supports image pickup device 1 by a lead portion. A front case 3 of the portable telephone has a front opening 3*a* for image pickup device 1. A lens of image pickup device 1 is positioned inside front case 3 directly below front opening 3*a*. FIG. 1 further shows a rear case 4 and a liquid crystal display 5. Liquid crystal display 5 is arranged on circuit board 2 adjacent to image pickup device 1. Image pickup device 1 is mounted at the opening of circuit board 2. As shown in FIG. 1, the lower portion of image pickup device 1 is arranged close to rear case 4 below circuit board 2, and the lens of image pickup device 1 is arranged close to front opening 3*a*. In the present embodiment, image pickup device 1 is positioned at opening of circuit board 1, so that the outer shape of the portable telephone can be designed without impairing the appearance of front case 3 and rear case 4 of the portable telephone.

Figure 2A:
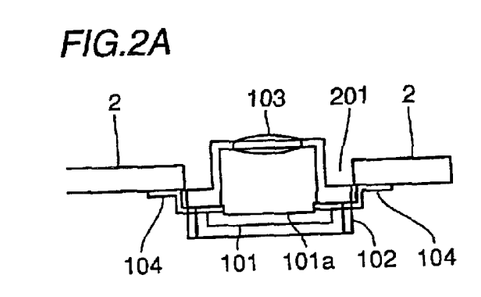
FIGS. 2A and 2B are cross sectional views partially showing in enlargement the portion of FIG. 1 where the image pickup device is mounted.
Figure 2B:
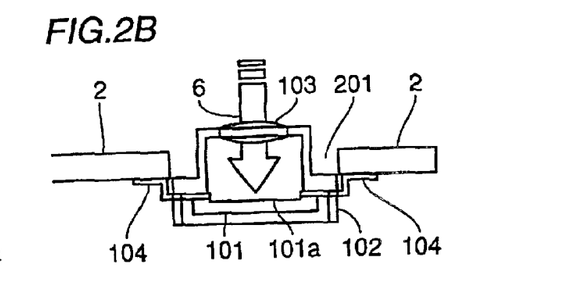

FIGS. 2A and 2B are cross sectional views partially showing in enlargement a portion of FIG. 1 where the image pickup device is provided. FIGS. 2A and 2B show an image pickup element 101, a light receiving sensor 101*a* formed on image pickup element 101, a cylindrical portion for lens 102 also serving as a casing of image pickup device 1, a lens 103 supported by cylindrical portion for lens 102, and a lead portion for an input/output signal 104 for the operation of image pickup element 101. Lead portion 104 is fixed to image pickup device 1. A circuit board 2 of the portable telephone is electrically connected to lead portion 104 of image pickup device 1. Circuit board 2 has an opening 201 used for mounting image pickup device 1 onto circuit board 2. The light that is incident on image pickup device 1 in the direction indicated by an arrow 6 in FIG. 2B is focused by lens 103 and received by light receiving sensor 101*a*. An electric signal, obtained by photoelectrical conversion of light receiving sensor 101*a*, is output from lead portion 104 to the side of circuit board (mother board) 2. Note that FIGS. 1 and 2 only show an optical portion, and a method of electrically connecting image pickup element 101 is not illustrated in detail. The method of mounting image pickup element 101 has been described as a method of face down bonding. Alternatively, image pickup device 1 may be electrically connected to circuit board 2 by die bonding or wire bonding as in the case of FIG. 18.

Image pickup device 1 adapted to be mounted to a portable telephone has lens 103 with a fixed focus that is integrally assembled with cylindrical portion for lens 102 for the purpose of reducing size and cost. A focal distance from an optical center of lens 103 to light receiving sensor 101*a* of image pickup element 101 is governed by an optical design, which may not be reduced to as low as an optically set value. Here, the optically set value is determined by a required specification of image pickup device 1, i.e., required image size, pixel size of image pickup element 101, field angle of the lens and so on. The focal distance of at least 2 mm must be ensured even if an image size of a QCIF (Quarter Common Intermediate Format; 176×144 pixels) is optically designed with use of image pickup element 101 having light receiving sensor 101*a* with pixels each reduced in size, e.g., a light receiving area of ⅐ inches. If the angular aperture of the light receiving portion of each pixel is large, i.e., if a sensitive image pickup element with greater size of pixels, for example with a size of ¼ inches, is used, the focal distance becomes 5 mm or greater. As a result, miniaturization of image pickup device 1 becomes extremely difficult.

However, in the first embodiment, the dimensional restriction in the focal distance direction of the image pickup device, which is governed by the aforementioned optical design, can be alleviated by mounting image pickup device 1 on circuit board 2, so that a portable telephone with reduced size and thickness can be provided. According to the first embodiment, for the thickness of the portable telephone, an opening 201 is formed in circuit board 2 of the portable telephone, in which image pickup device 1 is provided. Thus, a portion of the focal distance of image pickup device 1 can be included in the thickness of circuit board 2. If the image pickup device is mounted on the front or back surface of circuit board 2 as in the conventional case, (focal distance+thickness of circuit board) is inevitably included as the thickness of the portable telephone at the portion where the image pickup device is mounted. By contrast, in the first embodiment, the thickness of the portable telephone may only correspond to the focal distance since image pickup device 1 is mounted at opening 201 in circuit board 2. Thus, the portable telephone with reduced thickness can be achieved.

Figure 3A:
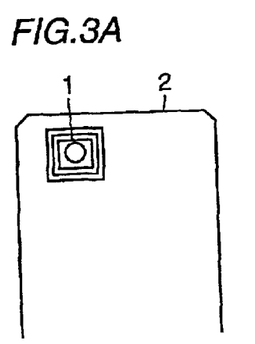
FIGS. 3A, 3B and 3C are diagrams showing the image pickup device provided in the opening of the circuit board according to the first embodiment.
Figure 3B:
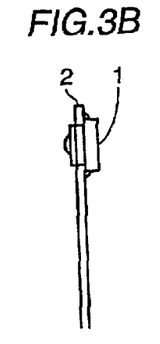
Figure 3C:
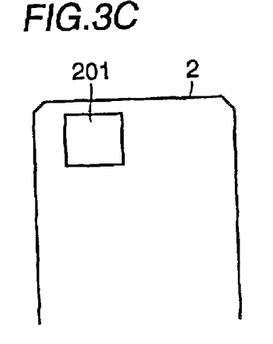
Figure 4A:
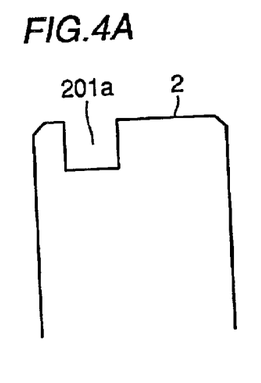
FIGS. 4A and 4B are diagrams shown in conjunction with the image pickup device provided in a cutout portion of the circuit board according to the first embodiment.
Figure 4B:
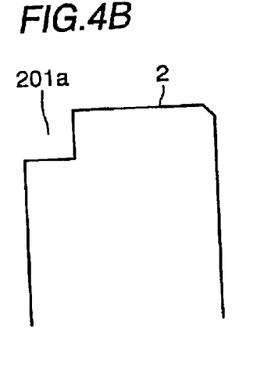

If, as in the conventional case, image pickup device 1 is mounted on the front or back surface of circuit board 2, an unnecessary space is formed between the surface of circuit board 2 that is opposite image pickup device 1 and the case of the portable telephone. However, in the first embodiment, the space defined by circuit board 2 and rear case 4 is used for mounting image pickup device 1 as shown in FIG. 1. Thus, the portable telephone can be reduced in size and thickness. Note that, although image pickup device 1 is illustrated in the first embodiment as being mounted at opening 201 formed in circuit board 2 as shown in FIGS. 3A, 3B, and 3C, the first embodiment is not limited to this. For example, as shown in FIGS. 4A and 4B, a cutout portion 201*a* may be formed in circuit board 2 of the portable telephone, at which image pickup device 1 is mounted to produce a similar effect. Cutout portion 201*a* may be formed at the upper portion near the side of circuit board 2 as shown in FIG. 4A or, at the corner of the upper portion of circuit board 2 as shown in FIG. 4B. The position of cutout portion 201*a* may be determined according to the intended position of lens 103 of image pickup device 1 at front case 3 of the portable telephone.

The input/output signal portion of image pickup device 1 has been described as being of a lead pattern. However, an image pickup device with a different type of circuit board, e.g., FPC Flexible Printed Circuit), may be employed to provide a structure similar to the first embodiment. Accordingly, in the first embodiment and the embodiments which will later be described, the type of the circuit board of image pickup device 1 is not particularly limited. Therefore, a lead portion is a broad concept ranging from a lead pattern to FPC. Note that if opening 201 of circuit board 2 is formed in a rectangular shape as shown in FIGS. 3A and 3C, an interconnection may be formed along four sides of the portion where the image pickup device is mounted, which is advantageous in designing the circuit board. In addition, the first embodiment enables image pickup device 1 to be inserted to opening 201 for temporary assembly. Thus, opening 201 serves as a positional guide of image pickup device 1, thereby facilitating handling and manufacture of a product.

Second Embodiment

Figure 5:
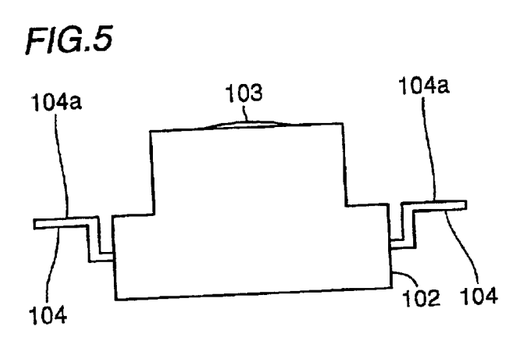
FIG. 5 is a side view showing an image pickup device according to a second embodiment.
Figure 6:
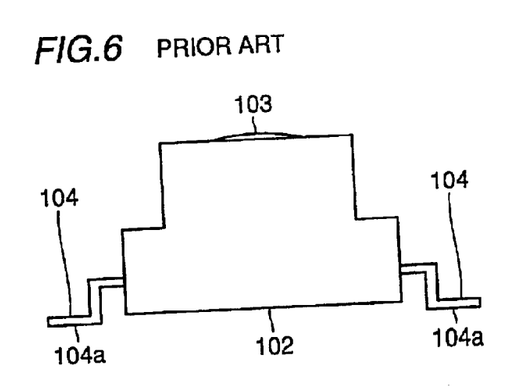
FIG. 6 is a side view showing a conventional image pickup device.
Figure 7A:
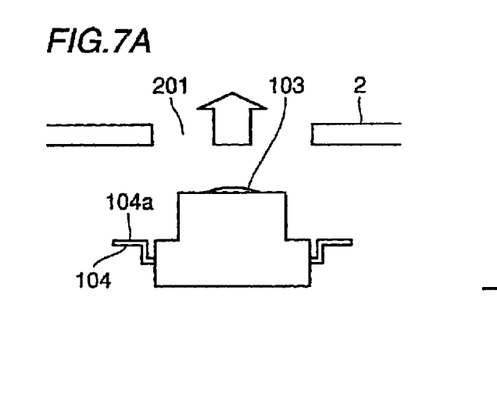
FIG. 7A is a sectional side view partially showing a portable telephone provided with an image pickup device according to the second embodiment.
Figure 7B:
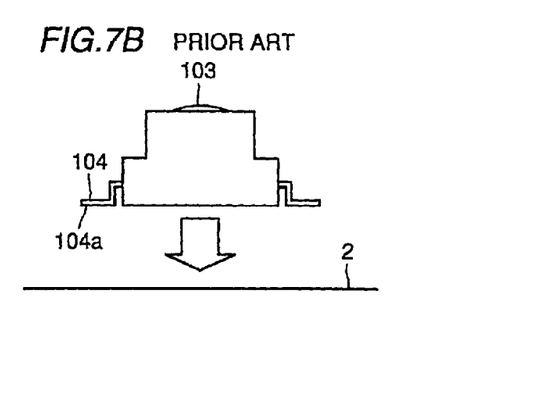
FIG. 7B is a sectional side view partially showing a conventional portable telephone provided with an image pickup device.
Figure 8A:
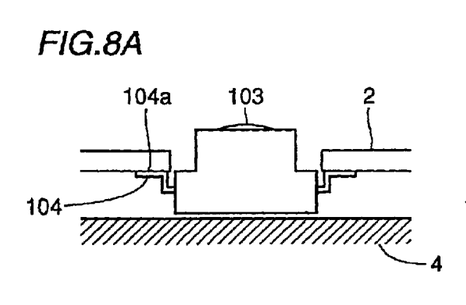
FIGS. 8A and 8B are cross sectional views partially showing the portable telephone provided with the image pickup device according to the second embodiment.
Figure 8B:
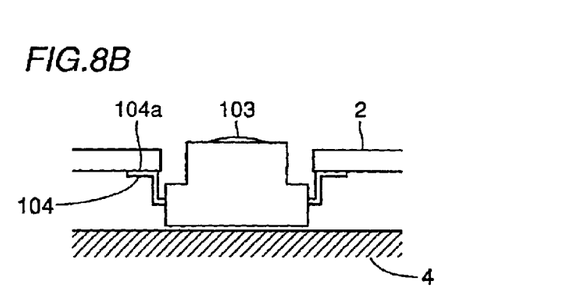

The second embodiment will be described with reference to FIGS. 5, 6, 7A and 7B. FIGS. 5 and 6 are side views showing an image pickup device 1. FIGS. 7A and 7B are sectional side views partially showing a portable telephone provided with an image pickup device according to the second embodiment. These figures show a cylindrical portion for lens 102, a lens 103, a lead portion for signal input/output 104 that extends from cylindrical portion for lens 102 of image pickup device 1 and that is bent as shown in FIG. 7A, and a soldering surface 104a. Soldering surface 104a refers to a surface (a portion) used for electrically connecting lead portion 104 to circuit board 2. In FIGS. 5 and 7A, soldering surface 104a faces toward the side of lens 103 to be connected on the lower side of circuit board 2. By contrast, in the conventional image pickup device, soldering surface 104a faces toward the side opposite lens 103 as shown in FIG. 6. FIGS. 8A and 8B show a rear case 4 of the portable telephone. As shown in FIG. 7A, image pickup device 1 is mounted in a direction of inserting to opening 201 in circuit board 2. The surface of circuit board 2 for electrical connection is opposite soldering surface 104a of lead portion 104. Thus, a connection is made on the back side (lower side of FIG. 7A) of circuit board 2 when viewed from the side of lens 3 of image pickup device 1 (namely, when viewed from the upper side of FIG. 7A).

On the other hand, in the conventional portable telephone provided with an image pickup device, the direction of mounting the image pickup device to the circuit board is indicated by an arrow in FIG. 7B. In this case, the image pickup device is mounted on and electrically connected to the front side of circuit board 2 when viewed from the side of lens 103 (from the upper side of FIG. 7B). Thus, in the conventional case, if opening 201 is formed in circuit board 2 for mounting the image pickup device, an electrical connection is impossible. In the second embodiment, however, image pickup device 1 can be inserted to and mounted at opening 201 of circuit board 2 and a connection can be made on the back side of circuit board 2 when viewed from the side of lens 103. Further, in the conventional portable telephone with an image pickup device, an unnecessary space is formed between the back side of circuit board 2 and rear case 4 which varies according to a type of portable telephone or its manufacturer.

The second embodiment enables effective utilization of such a space irrespective of the size of the space. FIGS. 8A and 8B are cross sectional views partially showing the portable telephone provided with the image pickup device according to the second embodiment. As shown in FIGS. 8A and 8B, the configuration of lead portion 104 is determined to provide for effective utilization of the above mentioned unnecessary space. More specifically, if the unnecessary space is small, lead portion 104 is configured to have a small height as shown in FIG. 8A; If the space is large, lead portion 104 is configured to have a greater height as shown in FIG. 8B. Thus, the unnecessary space between circuit board 2 and the rear case can be effectively utilized according to the type of the portable telephone, so that a portable telephone with reduced size and thickness can be provided. Note that although image pickup device 1 has been described as taking an image of an object in a direction toward the front case, the image pickup direction may be in a direction toward the rear case to provide a similar structure.

Third Embodiment

Figure 9:
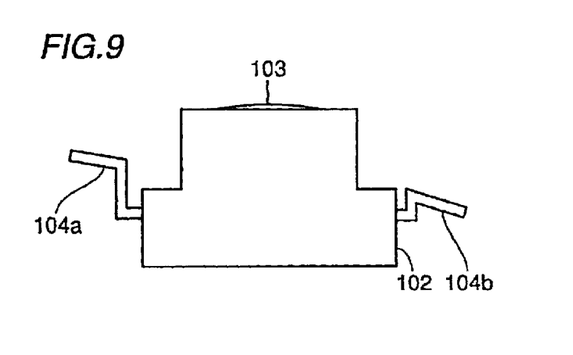
FIG. 9 is a side view showing a part of a portable telephone provided with an image pickup device according to a third embodiment.
Figure 10:
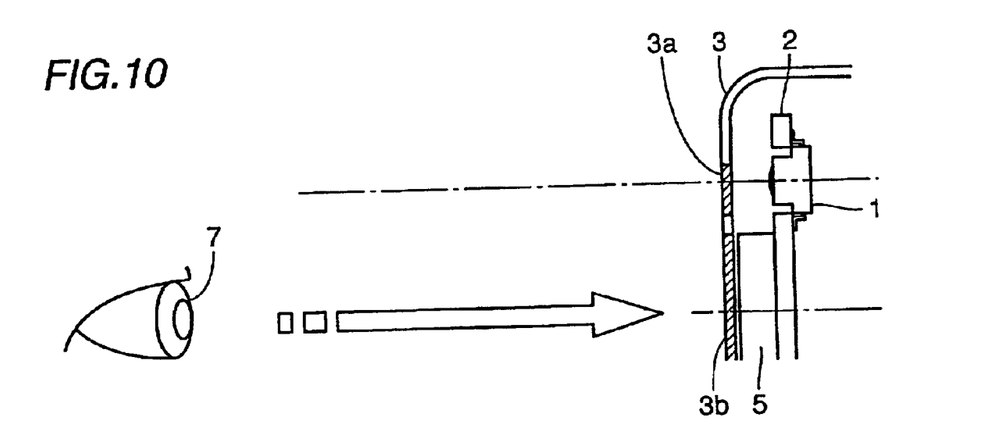
FIGS. 10 and 11 are diagrams shown in conjunction with visual lines of a user when using the portable telephone provided with the image pickup device according to the third embodiment.
Figure 11:
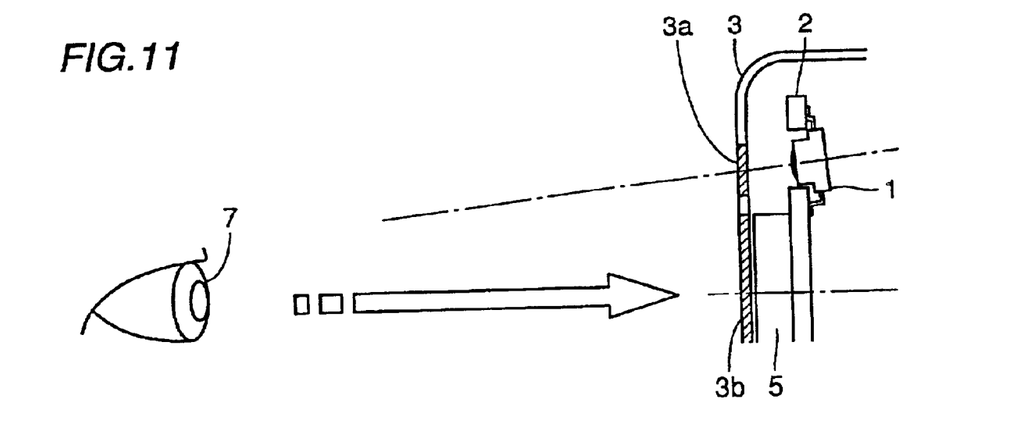

Now, the third embodiment will be described with reference to FIG. 9. FIG. 9 is a cross sectional view partially showing a portable telephone provided with an image pickup device according to the third embodiment. FIG. 9 includes a cylindrical portion for lens 102, a lens 103, and lead portions 104a, 104b for signal input/output. Lead portions 104a and 104b are respectively provided on both sides of image pickup device 1. One lead portion 104a has its portion to be connected to the back side of circuit board 2 upwardly inclined, whereas the other lead portion 104b has a downwardly inclined counterpart. Namely, lead portion 104 is configured such that the image pickup direction of image pickup device 1 is at a prescribed angle with respect to the surface of circuit board 2 when image pickup device 1 is mounted on circuit board 2 as shown in FIG. 9. Further description will be given with reference to FIGS. 10 and 11. FIGS. 10 and 11 are diagrams shown in conjunction with visual lines of a user when using the portable telephone with the image pickup device. FIGS. 10 and 11 show an image pickup device 1, a circuit board 2 for a portable telephone, a front case 3 of portable telephone, a front opening 3a for the image pickup device formed in front case 3, a liquid crystal display 5, a front opening 3b for the liquid crystal display, and an eye 7 of the user.

When image pickup device 1 is mounted to circuit board 2 as shown in FIG. 10, if the visual line of the user from eye 7 is in a direction indicated by an arrow, with the image pickup direction of image pickup device 1 being normal (perpendicular) to the surface of circuit board 2, the image pickup direction of image pickup device 1 and the display direction of liquid crystal display 5 are parallel to each other. As a result, eye 7 is positioned lower than a center of the image pickup device. Therefore, it becomes difficult to position a self-portrait taken by image pickup device 1 at the central portion of liquid crystal display 5. However, in the third embodiment, when image pickup device 1 is mounted to circuit board 2 as shown in FIG. 11, lead portion 104 of image pickup device 1 is configured in such a way as shown in FIG. 9 that the image pickup direction of image pickup device 1 is at a prescribed angle with respect to the surface of circuit board 2. Thus, when the visual line of the user is directed from eye 7 as indicated by an arrow in FIG. 11, image pickup device 1 and liquid crystal display 5 and self-portrait can be seen from the position at which the image pickup direction of image pickup device 1 and the display direction of liquid crystal display 5 intersect. Thus, the self-portrait taken by image pickup device 1 can readily be positioned at the central portion of liquid crystal display 5. It is noted that although the image pickup direction of image pickup device 1 provided in the portable telephone is not necessarily in the same direction as that of the liquid crystal display, exemplary typical applications of the portable telephone with the image pickup device mounted in the same direction as in the third embodiment include an application for a picture telephone. In such an application, it is important to note that its user takes a self-portrait to be displayed at the central portion of the liquid crystal display, and its controllability falls within the scope of the performance of the portable telephone.

Fourth Embodiment

Figure 12A:
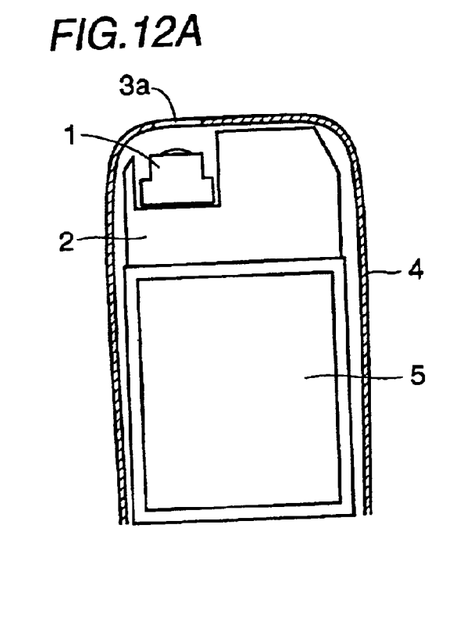
FIGS. 12A and 12B are front and side views showing the portable telephone provided with the image pickup device with its front case removed according to a fourth embodiment.
Figure 12B:
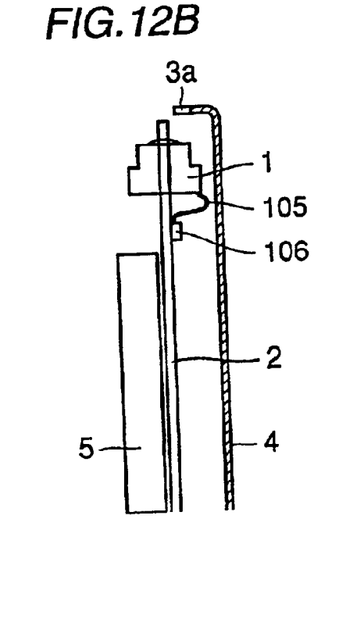
Figure 13A:
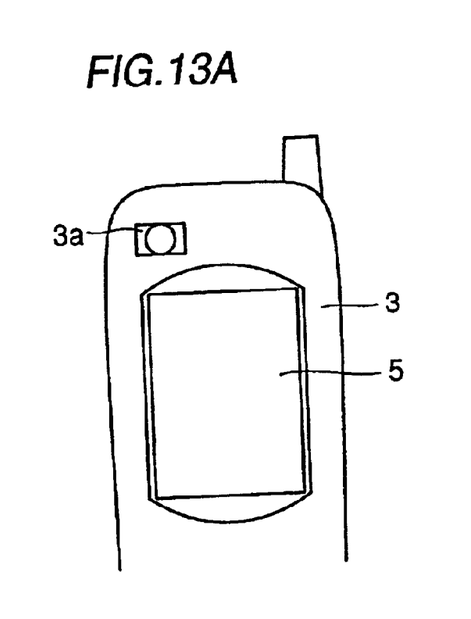
FIGS. 13A and 13B are diagrams of the portable telephone provided with the image pickup device according to the fourth embodiment shown in conjunction with an image pickup direction thereof.
Figure 13B:
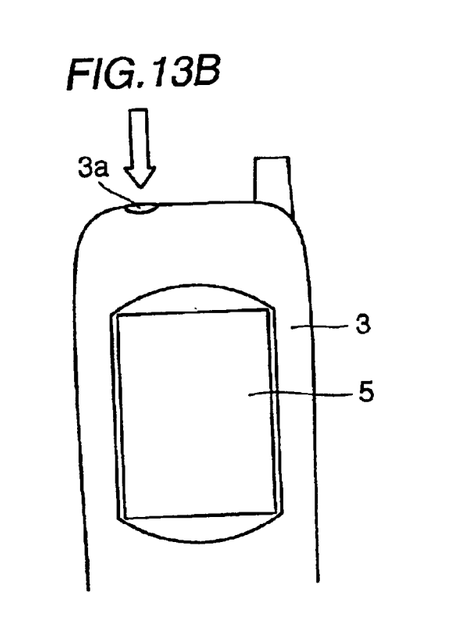

Now, the fourth embodiment will be described with reference to FIGS. 12A, 12B, 13A and 13B. FIG. 12A is a front view showing a portable telephone provided with an image pickup device according to the fourth embodiment with its front case removed, and FIG. 12B is a side view thereof. FIG. 12A shows an image pickup device 1, a circuit board 2, a front opening 3a for the pickup device formed in the case of the portable telephone, a rear case 4, and a liquid crystal display 5. Image pickup device 1 employs an FPC (Flexible Pattern Circuit) for a circuit board. FIG. 12B shows an FPC 105 for signal input/output, and a connector 106 for electrically connecting image pickup device 1 to circuit board 2. FIGS. 13A and 13B are views shown in conjunction with an image pickup direction of the portable telephone with the image pickup device according to the fourth embodiment. Note that reference characters of FIGS. 13A and 13B denote the same portions as in FIGS. 12A and 12B, and therefore detailed description will not be repeated. In the above described third embodiment, image pickup device 1 is adapted to take an image of an object opposite the liquid crystal display. In the fourth embodiment, the image pickup direction is parallel to the surface of circuit board 2 as indicated by an arrow in FIG. 13B.

Generally, a lens of image pickup device 1 is positioned opposite the image pickup element, being electrically connected to any of the front and back surfaces of circuit board 2. Thus, it is difficult to mount image pickup device 1 to take an image of an object in the direction parallel to the surface of circuit board 2 as shown in FIG. 13B. Then, the fourth embodiment forms a cutout portion in circuit board 2 to receive image pickup device 1, so as to make parallel an optical axis direction of image pickup device 1 and the surface direction of circuit board 2. Note that although the fourth embodiment provides the optical axis direction of image pickup device 1 in parallel with the surface of circuit board 2, the optical axis does not necessarily have to be precisely parallel thereto and, rather, it may be roughly parallel. Similarly, the optical axis direction of image pickup device 1 does not necessarily have to be parallel to the surface of circuit board 2, and may be at a desired angle thereto.

Fifth Embodiment

Figure 14A:
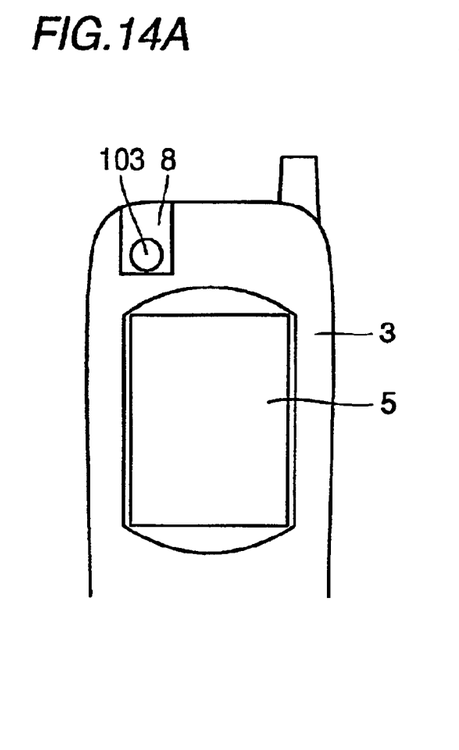
FIGS. 14A and 14B are diagrams shown in conjunction with the portable telephone provided with the image pickup device according to a fifth embodiment.
Figure 14B:
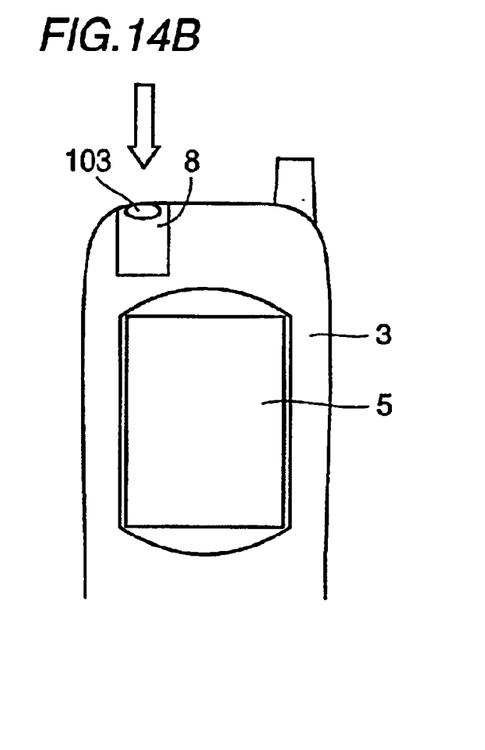
Figure 15A:
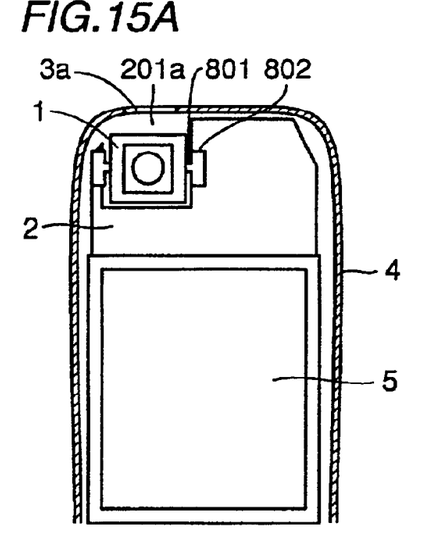
FIGS. 15A, 16A and 17A are diagrams shown in conjunction with an operation of rotating the image pickup device according to a fifth embodiment.
Figure 15B:
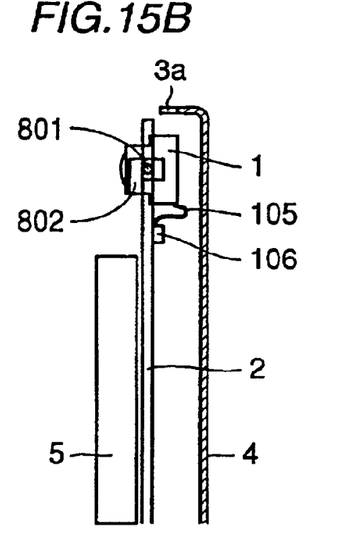
FIGS. 15B, 16B and 17B are side views shown in conjunction with the operation of rotating the image pickup device according to the fifth embodiment.
Figure 16A:
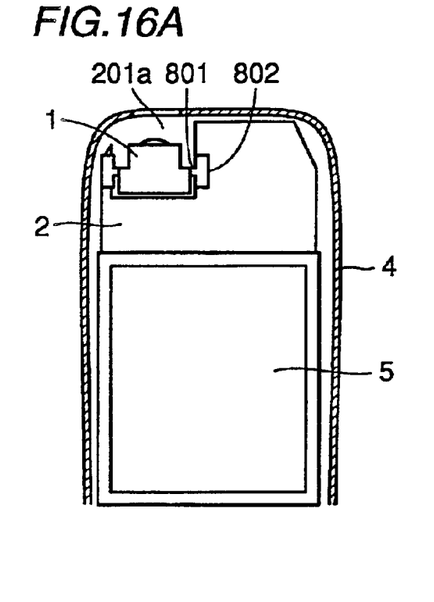
Figure 16B:
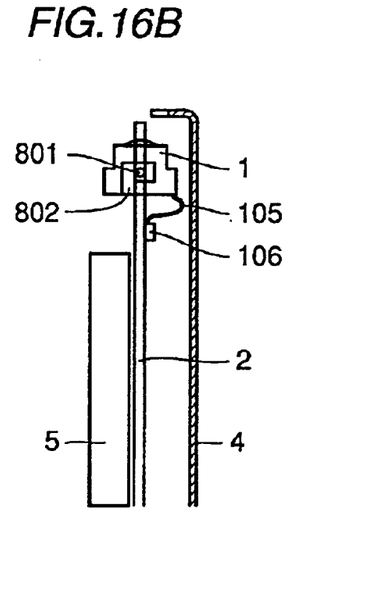

The fifth embodiment will be described with reference to FIGS. 14A, 14B, 15A, 15B, 16A, 16B, 17A and 17B. FIGS. 14A and 14B are diagrams shown in conjunction with the structure of a portable telephone with an image pickup device according to the fifth embodiment. FIGS. 14A and 14B show a front case 3, a lens 103, a liquid crystal display 5, and a rotatable mechanism 8 of image pickup device 1. Image pickup device 1 is made rotatable because of rotatable mechanism 8. As such, image pickup device 1 is shown facing front in FIG. 14A and facing downward in FIG. 14B. FIGS. 15A, 16A and 15B, 16B are respectively front and side views shown in conjunction with the operation of rotating image pickup device 1 according to the fifth embodiment. FIGS. 15A, 15B, 16A and 16B show a shaft 801 and a bearing 802. Image pickup device 1 is fixed to shaft 801, which is in turn supported by bearing 802.

Generally, the portable telephone with the image pickup device would be primarily used in two fields of applications. More specifically, the portable telephone with the image pickup device would be used to take a self-portrait which is then used for a variety of purposes, or to take an image other than the self-portrait, e.g., a scenery, as in the case of a still camera. In any case, the taken image information is displayed onto a liquid crystal display for use. In the case shown in FIG. 13A, image pickup device 1 is mounted to take an image in the same direction as the display direction of the liquid crystal display. As such, image pickup device 1 provides excellent controllability when a user takes an image of a self-portrait while verifying the images displayed on the liquid crystal display. However, in the case of an image of a scenery or the like, it is difficult to verify the images on the liquid crystal display from the user side with image pickup device 1 positioned in the image pickup direction, and hence image pickup device 1 exhibits inferior controllability.

Conversely, in the case as shown in FIG. 13B, image pickup device is mounted to take an image in the direction different from the display direction of the liquid crystal display. As such, image pickup device 1 exhibits excellent controllability when a user takes an image of a scenery or the like while verifying the taken images displayed on the liquid crystal display. However, in the case of taking an image of the self-portrait, it is difficult to verify the taken image on the liquid crystal display from the user side with the image pickup device positioned in the image pickup direction, and hence image pickup device 1 exhibits inferior controllability. To solve the above mentioned problem, as shown in FIGS. 14A and 14B, rotatable mechanism 8 may be provided to freely rotate image pickup device 1 in a desired direction. To this end, however, additional mechanism as well as a space for allowing rotation are required, whereby the size of the portable telephone increases.

Figure 17A:
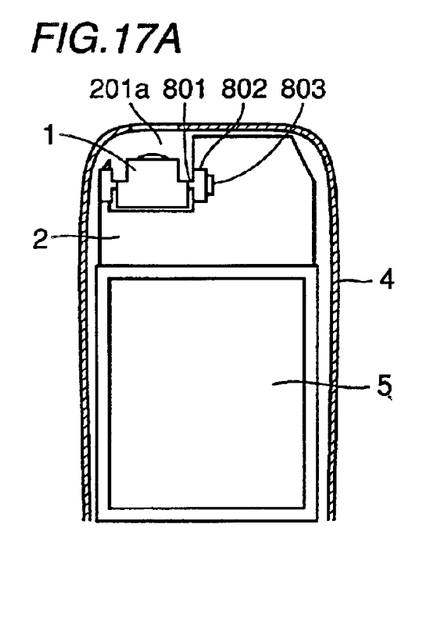
Figure 17B:
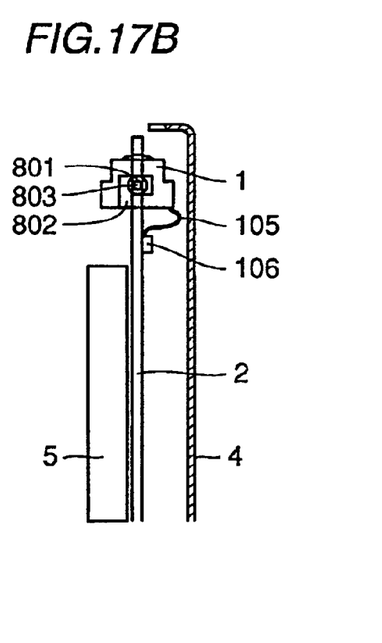

In the fifth embodiment, a cutout portion 201a is formed in circuit board 2 at the portion where the image pickup device is mounted for allowing rotation of image pickup device 1 thereat. In the present embodiment, in particular, cutout portion 201a is formed at a corner of circuit board 2. Cutout portion 201a in circuit board 2 enables the portable telephone with the image pickup device capable of taking images in all directions to be provided without increasing the size of the portable telephone. To hold image pickup device 1 in a desired position, as shown in FIGS. 17A and 17B, a friction mechanism 803, wheel or the like may be additionally provided in rotatable mechanism 8 for supporting image pickup device 1 in a prescribed position.

As described above, according to the present invention, the image pickup device is mounted in the opening formed in the circuit board, so that the portable telephone mounted with an image pickup device can be effectively reduced in size and thickness.

Further, according to the present invention, the image pickup device is mounted at the cutout portion formed in the circuit board and the rotatable mechanism is provided, so that the portable telephone mounted with the image pickup device capable of freely taking an image in a direction with respect to the front side and the back side of the liquid crystal display can be effectively provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A portable telephone provided with an image pickup device, comprising:

a case defining an outer shape of the portable telephone;

a circuit board provided in said case and having an opening;

an image pickup device, said image pickup device including a lens focusing an externally received image and an image pickup element converting the image focused by said lens to an electric signal; and a lead portion electrically connecting said circuit board and said image pickup device with said image pickup device being inserted in said opening of said circuit board wherein a liquid crystal display is provided in said case, and said lead portion includes portions of different shapes respectively formed at both sides of said image pickup device such that said image pickup device is inclined toward said liquid crystal display with respect to said circuit board.

2. The portable telephone provided with the image pickup device according to claim 1, wherein said lead portion is in a bent shape connected to said image pickup device.

3. The portable telephone provided with the image pickup device according to claim 1, wherein said lead portion is connected to a surface of said circuit board opposite said lens.

4. The portable telephone provided with the image pickup device according to claim 3, wherein said circuit board has first and second surfaces respectively forming front and back sides, said case includes front and rear cases primarily covering said first and second surfaces of said circuit board respectively, and said lead portion connects said circuit board and said image pickup device such that said lens and said image pickup element are respectively positioned on said first and second surface sides of said circuit board.

5. A portable telephone provided with an image pickup device, comprising:

a case defining an outer shape of a portable telephone;

a circuit board provided in said case and having a cutout portion;

an image pickup device, said image pickup device including a lens focusing an externally received image and an image pickup element converting the image focused by said lens to an electric signal, and said image pickup device being mounted to said circuit board in such a way that an image can be taken in directions parallel and perpendicular to a surface of said circuit board; and a lead portion electrically connecting said circuit board and said image pickup device with said image pickup device being inserted in said cutout portion of said circuit board.

6. The portable telephone provided with the image pickup device according to claim 5, wherein said circuit board has first and second surfaces respectively forming front and back sides, and said image pickup device further includes a rotatable mechanism rotatably supporting said image pickup device in said cutout portion such that said image pickup device can take an image in a desired direction with respect to said first surface and said second surface of said circuit board.

7. The portable telephone provided with the image pickup device according to claim 6, wherein said rotatable mechanism includes a shall fixed to said image pickup device, and a bearing rotatably supporting said shaft.

8. The portable telephone provided with the image pickup device according to claim 6, wherein said rotatable mechanism includes a holding mechanism capable of holding said image pickup device in a desired direction with respect to said first surface and said second surface of said circuit board.

* * * * *